(12) United States Patent
Swoboda et al.

(10) Patent No.: US 9,157,958 B2
(45) Date of Patent: Oct. 13, 2015

(54) BLOCKING THE EFFECTS OF SCAN CHAIN TESTING UPON A CHANGE IN SCAN CHAIN TOPOLOGY

(71) Applicant: Texas Instruments Incorporated, Dallas, TX (US)

(72) Inventors: Gary L. Swoboda, Sugar Land, TX (US); Robert A. McGowan, Cedar Park, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/717,632

(22) Filed: May 20, 2015

(65) Prior Publication Data

US 2015/0253386 A1    Sep. 10, 2015

Related U.S. Application Data

(62) Division of application No. 14/567,266, filed on Dec. 11, 2014, now Pat. No. 9,063,197, which is a division of application No. 14/149,139, filed on Jan. 7, 2014, now Pat. No. 8,938,651, which is a division of application No. 13/859,968, filed on Apr. 10, 2013, now Pat. No. 8,656,234, which is a division of application No. 13/712,214, filed on Dec. 12, 2012, now Pat. No. 8,464,111, which is a division of application No. 13/564,339, filed on Aug. 1, 2012, now Pat. No. 8,359,502, which is a division of application No. 12/116,471, filed on May 7, 2008, now Pat. No. 8,261,143.

(60) Provisional application No. 60/928,034, filed on May 7, 2007.

(51) Int. Cl.
| | |
|---|---|
| *G01R 31/28* | (2006.01) |
| *G01R 31/3177* | (2006.01) |
| *G01R 31/317* | (2006.01) |
| *G01R 31/3185* | (2006.01) |
| *G06F 11/22* | (2006.01) |

(52) U.S. Cl.
CPC ...... *G01R 31/3177* (2013.01); *G01R 31/31705* (2013.01); *G01R 31/318533* (2013.01); *G01R 31/318536* (2013.01); *G01R 31/318544* (2013.01); *G01R 31/318555* (2013.01); *G01R 31/318572* (2013.01); *G01R 31/318597* (2013.01); *G06F 11/2236* (2013.01)

(58) Field of Classification Search
CPC ............... G01R 31/318533; G01R 31/318536; G01R 31/31705; G01R 31/3177; G01R 31/318544; G01R 31/318555; G01R 31/318572; G01R 31/318597; G06F 11/2236
USPC .......................................... 714/726, 727, 729
See application file for complete search history.

(56) References Cited

U.S. PATENT DOCUMENTS 6,157,210 A * 12/2000 Zaveri et al. ..................... 326/40
6,615,380 B1 * 9/2003 Kapur et al. ................... 714/738

(Continued)

*Primary Examiner* — John J Tabone, Jr.
(74) *Attorney, Agent, or Firm* — Lawrence J. Bassuk; Charles A. Brill; Frank D. Cimino

(57) ABSTRACT

A system comprises a plurality of components, scan chain selection logic coupled to the components, and override selection logic coupled to the scan chain selection logic. The scan chain selection logic selects various of the components to be members of a scan chain under the direction of a host computer. The override selection logic detects a change in the scan chain and, as a result, blocks the entire scan chain from progressing.

3 Claims, 3 Drawing Sheets

(56) References Cited

U.S. PATENT DOCUMENTS

| | | | |
|---|---|---|---|
| 6,766,487 B2 * | 7/2004 | Saxena et al. | 714/726 |
| 6,829,730 B2 * | 12/2004 | Nadeau-Dostie et al. | 714/30 |
| 6,886,110 B2 * | 4/2005 | O'Brien | 714/34 |
| 6,928,606 B2 * | 8/2005 | Savaria et al. | 714/797 |
| 7,139,950 B2 * | 11/2006 | Huisman et al. | 714/726 |
| 7,200,783 B2 * | 4/2007 | Whetsel | 714/729 |
| 7,219,284 B2 * | 5/2007 | Saxena et al. | 714/729 |
| 7,322,000 B2 * | 1/2008 | Colunga et al. | 714/727 |
| 7,509,549 B2 * | 3/2009 | Larson et al. | 714/726 |
| 7,555,422 B2 * | 6/2009 | Newman et al. | 703/23 |
| 7,954,030 B2 * | 5/2011 | Saxena et al. | 714/734 |
| 7,984,349 B2 * | 7/2011 | Whetsel | 714/727 |
| 2003/0009715 A1 * | 1/2003 | Ricchetti et al. | 714/727 |
| 2006/0195739 A1 * | 8/2006 | O'Brien | 714/727 |
| 2007/0118782 A1 * | 5/2007 | Whetsel | 714/729 |
| 2008/0082879 A1 * | 4/2008 | Guettaf | 714/727 |
| 2009/0307545 A1 * | 12/2009 | Van Splunter et al. | 714/726 |
| 2011/0197102 A1 * | 8/2011 | Saxena et al. | 714/729 |

* cited by examiner

BLOCKING THE EFFECTS OF SCAN CHAIN TESTING UPON A CHANGE IN SCAN CHAIN TOPOLOGY

CROSS REFERENCE TO RELATED APPLICATIONS

This application is divisional of prior application Ser. No. 14/567,266, filed Dec. 11, 2014, now U.S. Pat. No. 9,063,197, granted Jun. 23, 2015;

Which was a divisional of prior application Ser. No. 14/149,139, filed Jan. 7, 2014, now U.S. Pat. No. 8,938,651, granted Jan. 20, 2015;

Which was a divisional of prior application Ser. No. 13/859,968, filed Apr. 10, 2013, now U.S. Pat. No. 8,656,234, granted Feb. 18, 2014;

Which was a divisional of prior application Ser. No. 13/712,214, filed Dec. 12, 2012, now U.S. Pat. No. 8,464,111, granted Jun. 11, 2013;

Which was a divisional of prior application Ser. No. 13/564,339, filed Aug. 1, 2012, now U.S. Pat. No. 8,359,502, granted Jan. 22, 2013;

Which was a divisional of prior application Ser. No. 12/116,471, filed May 7, 2008, now U.S. Pat. No. 8,261,143, granted Sep. 4, 2012; and This application claims priority to U.S. Provisional Application No. 60/928,034 filed May 7, 2007 entitled "Method to inform a JTAG scan controller of a change in scan topology," incorporated herein by reference.

BACKGROUND

In many embedded designs, the Joint Test Action Group (JTAG, IEEE 1149.1) interface on a device or system provides access to test and debug capabilities on, for example, a processor. This interface conforms to the IEEE 1149.1 Test Access Port (TAP) protocol and requirements. Systems-on-a-chip designs often have multiple cores, each of which has their own TAP. When multiple processors are present in a system, the TAP of each processor could be connected in series or dynamically managed by a TAP linking module. When a TAP linking module exists on a device, debug software, executing on a host, programmatically selects which TAPs are to be connected in series and visible between the JTAG input and output pins (test data in (TDI) and test data out (TDO)).

Usually, the selection of which secondary TAPs are linked together to form the scan path between the system's TDI and TDO pins is explicitly specified and programmed by the host debug system. When a TAP is added to the master scan path, the length of the scan path between the TDI and TDO will increase due to the inclusion of the scan bits in the newly added TAP. Because the host has programmed the selection of the newly added TAP, the host knows that the overall scan path length has changed. In this fashion, the host always knows the overall length of the scan path between the TDI and TDO pins and the location of the serial scan chain of each selected TAP.

There are circumstances, however, in which the TAP linking module must deselect and unlink a secondary TAP without being explicitly instructed to do so by command from the host. For example, if power is turned off to one of the secondary TAPs that is currently included in the master scan path, the serial scan chain between the device's TDI and TDO pins would be broken. Scan to any and all TAPs in the system would be broken because shift cannot occur through the shift registers in the now unpowered TAP. Another reason for spontaneously and abruptly, removing a secondary TAP from the master scan path is due to a change in scan access rights to a TAP. In order to protect confidential information being processed on an embedded device, some devices are equipped with security features to block viewing of some data. This requirement conflicts with the debug features provided on the JTAG interface that seeks to provide complete system visibility. A security module on the device may be programmed to prohibit all scan access to a TAP in the system. If this TAP is currently selected as part of the mater scan path, the TAP linking module must enforce the restricted scan access rights by deselecting the secondary TAP.

Ideally, the power and security settings for a secondary TAP should not change while the debug software has included the secondary TAP in the scan chain. However, system design considerations do not always make this possible. At times, the TAP linking module may be required to automatically disconnect from a secondary TAP. The disconnect can occur at any point in time, even while a scan operation is occurring. When the TAP linking module must make a change to the scan path that was not programmed by the host, the host's debug software will not know that the overall scan path length has changed. Furthermore, because one or more TAPs was eliminated from the serial scan path, the position of the remaining TAPs has changed. The length of the scan data generated by the debug software does not match the scan chain length. Since the host debug system is not aware of this change in position, it will incorrect apply scan bits to the wrong place and even the wrong TAP in the system. System behavior will be unpredictable and potentially harmful.

SUMMARY

In accordance with at least some embodiments, a method comprises a system under test (SUT) detecting a change in scan chain topology in the SUT. The method further comprises blocking the effects of scans initiated by the debug software until the debug software acknowledges it has recognized the scan chain length has changed. In some embodiments, the SUT informs the host that the scan chain attributes have been changed. Blocking the effects of scans includes preventing the scan chain states from progressing (i.e., freezing the scan).

In other embodiments, a system comprises a plurality of components, scan chain selection logic coupled to the components, and override selection logic connected to the scan chain selection logic. The scan chain selection logic selects various of the components to be members of a scan chain under the direction of a host computer. The override selection logic detects a change in the scan chain and, as a result, blocking the effects of scans initiated by the debug software until the debug software acknowledges it has recognized the scan chain attributes have changed.

Moreover, in the embodiments disclosed, normal scan operation is terminated. Terminating a "normal scan" means blocking the effects of scan initiated by the host system.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used within the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . . " Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
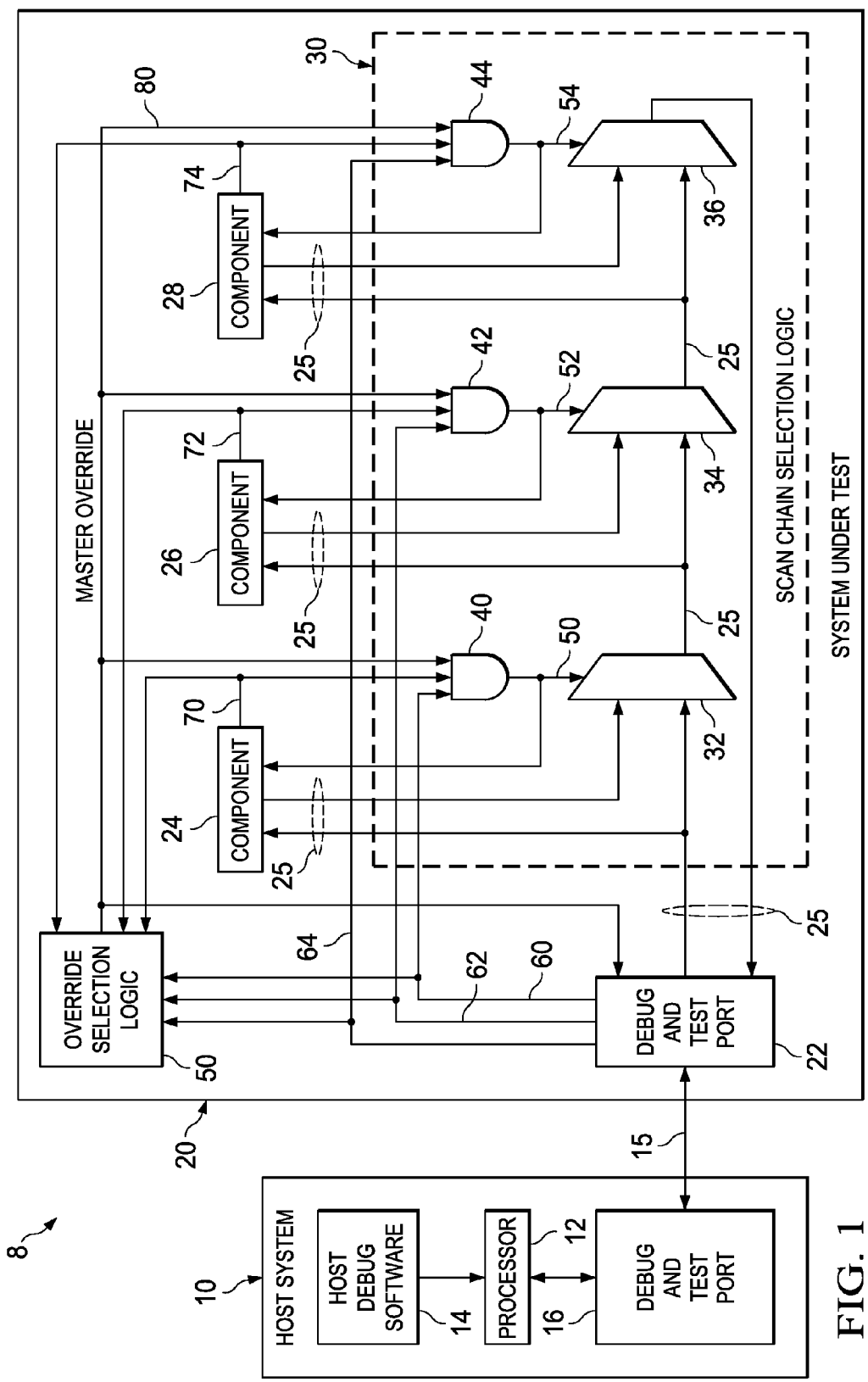
FIG. 1 shows a system in accordance preferred embodiments of the invention.

FIG. 1 illustrates a system 8 in accordance with an embodiment of the invention. System 8 includes a host system 10 coupled to a system under test (SUT) 20. The host system 10 comprises a processor that executes host debug software 14 to test the SUT 20. The host debug software 14 is stored on computer-readable media such as a volatile memory (e.g., random access memory), non-volatile storage (e.g., hard disk drive, read-only memory (ROM), CD ROM, Flash memory, etc.), download from a communications link, or combinations thereof. The host system 10 also comprises a debug and test port 16 which provides an electrical interface to the SUT 20.

The SUT 20 also comprises a corresponding debug and test port 22 coupled to the test and debug port 16 of the host system 10. The SUT 20 further comprises one or more components 24, 26, 28 to be selectively tested by the host system 10. Although three components 24-28 are shown, any number of testable components is possible. The components 24-28 may comprise processor cores or other types of circuitry to be tested. The host system 10, via its host debug software 14, selects one or more of the components 24-28 to be tested. If multiple components 24-28 are to be tested, the host debug software 14 commands the SUT 20 to connect the selected components in a configuration to be tested by the host system 10. The component configuration can be a series configuration or a star configuration. In a series configuration, the selected components are connected in series and scan chain bits generated by the host system 20 are provided to the first component in the series combination. The bits are routed from one component to the next in the series chain and the last component in the chain provides its output bits to the host system 20. In a star configuration, each target component to be tested is accessed directly by the host system 10.

In some embodiments, the debug and test ports 16, 22 are implemented according to the JTAG standard, but can be implemented in accordance with other standards as well.

Figure 5:
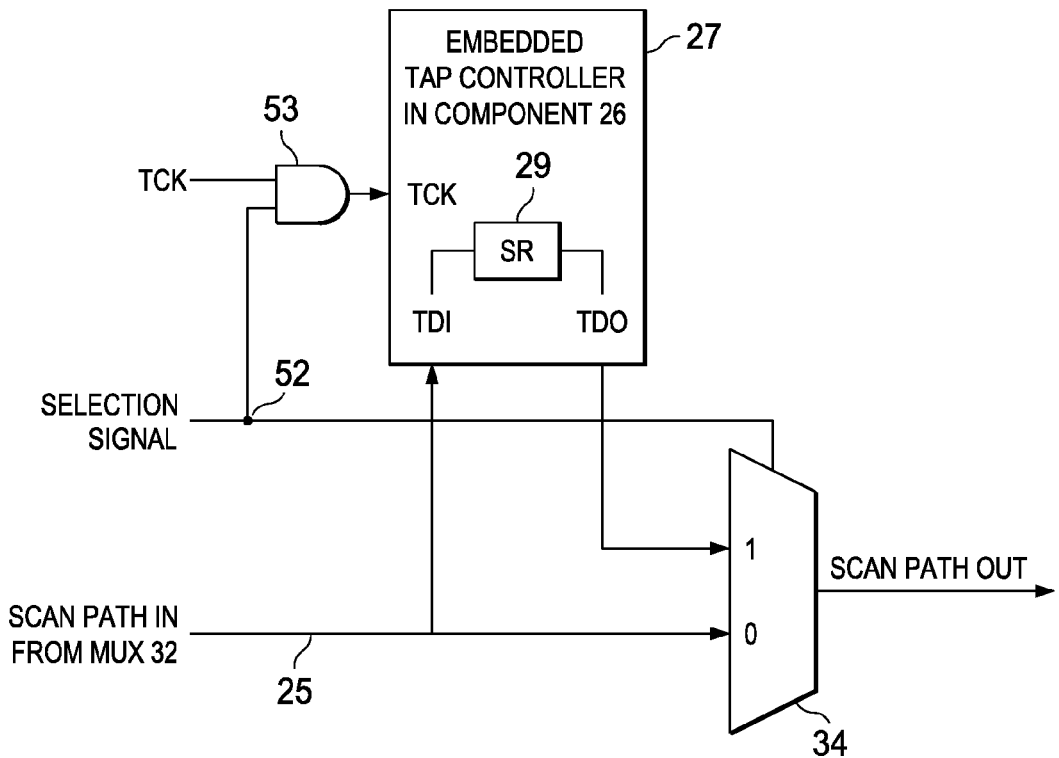
FIG. 5 shows an embodiment in which a state of an embedded TAP controller is frozen.

The SUT 20 also comprises scan chain selection logic 30. In the embodiment of FIG. 1, the scan chain selection logic 30 comprises a multiplexer that corresponds to each component 24-28 and means to stop the TAP controller state progression as shown in FIG. 5. As shown, multiplexer 32 corresponds to component 24, while multiplexers 34 and 36 correspond to components 26 and 28, respectively. The configuration of the SUT depicted in FIG. 1 is that of a series configuration. Each multiplexer selects either the output of the preceding multiplexer (or the data received from the debug and test port 22 in the case of the first multiplexer 32) or the output from a corresponding component 24-28 as the output of that multiplexer. The output of one multiplexer is coupled to the input of the next multiplexer in series. The output is also provided to the corresponding component for testing purposes. The output of the component is provided to the other input of the multiplexer. Thus, test input can be provided to each component in series and the multiplexers either select the test output from each component or bypass the component. The host system 10 has control over the multiplexers and in that fashion can select the components to be in the scan chain. When a multiplexer bypasses a component, the operation of the test features of the component is suspended as shown in FIG. 5.

A logic gate also is shown corresponding to each multiplexer. Gates 40, 42, and 44 correspond to each of multiplexers 32, 34, and 36, respectively. Although each gate may be implemented as any of a variety of logic gates, AND gates are shown in the illustrative embodiment of FIG. 1. Each gate 40-44 may be implemented as one logic gate or a combination of logic gates. In the embodiment of FIG. 1, each gate 40-44 generates a control signal to the corresponding multiplexer. Gate 40 generates control signal 50 for multiplexer 32. Gates 42 and 44 generate control signals 52 and 54 for multiplexers 34 and 36, respectively. Each control signal 50-54 causes the corresponding multiplexer to select one or the other of the multiplexer's inputs to be the output, as dictated by the state of the control signal. Additionally control signal 52 suspends the operation of the test clock TCK signal, through gate 27, to embedded TAP controller 27 in component 26.

Each control signal 50-54 is generated based on three input signals in accordance with the embodiment of FIG. 1. With each logic gate 40-44 implemented as an AND gate, the control signal is a logic "1" only if all three inputs are logic 1's; otherwise, the control signal is a logic 0. One of the three inputs to each logic gate 40-44 is from the SUT's test and debug port 22. The host system 10 sends a command to the SUT 20 to specify which of the components 24-28 is to be included in the scan chain for testing purposes. Via such a command from the host system 10, the test and debug port 22 generates a selection signal 60, 62, and 64 for each of gates 40-44. Each selection signal 60-64 dictates whether the component 24-28 corresponding to the various gates 40-44 are to be included in the scan chain. For example, the selection signals 60 and 64 may be asserted by the test and debug port 22 (as commanded by the host system 10) to select components 24 and 28, but not component 26, to be part of a particular scan chain.

Besides the selection signal from the test and debug port 22, the other two input signals to each gate 40-44 are from the corresponding component 24-28 and from an override selection logic 50. Despite the host system 10 desiring a particular component 24-28 to be included a particular scan chain, that particular component may preclude itself from being included in the scan chain. The reason for not being included in a scan chain may be due, as described previously, to the component's security level (e.g., a particular security mode or level may preclude access to the scan chain without proper authentication by the host system 10) or due to the component's power state (e.g., the component may be in a low power mode). For whatever reason, a component 24-28 may not be includable in a scan chain but, not aware of that fact, the host system 10 may attempt to include the component nonetheless. Accordingly, each component, or logic (not shown) associated with the component, asserts a component override signal to the gate. Components 24-28 assert component override signals 70-74, respectively. Each component selection override signal 70-74, when asserted (e.g., logic 0) causes the output of the corresponding AND gate 40-44 to be a logic 0 regardless of the state of the corresponding selection signals 60-64 from the test and debug port 22. As such, each component override signal 70-74 can override a command from the host system 10 to include the corresponding component 24-28 in the scan chain. In other embodiments, the asserted state of the component override signals can be a logic 1 depending on the implementation of gates 40-44.

If the host system 10, via host debug software 14, generates a scan chain data set under the assumption that certain components 24-28 are included in the scan chain (as previously configured by the host system) when, in fact, one or more of the components are not included in the scan chain, predictable and improper behavior may result. The length of the scan chain is different than the scan chain length believed by the host system 10 to be the case. The host system 10 generates the scan chain data for a particular scan chain length, but the data, if permitted to be sent to the scan chain with a different length may cause unpredictable SUT behavior. Accordingly, if one or more of the components 24-28 that the host system 10 specifies to be included in the scan chain cannot be included, in accordance with the preferred embodiments none of the components are included. By disabling the entire scan chain, the potentially harmful effects that the scan chain might have on the SUT 20 are minimized or eliminated.

Referring still to FIG. 1, the component override signals 70-74 from the individual components 24-28 are also provided to the override selection logic 50 in addition to, or instead of, the gates 40-44. The override selection logic 50 also receives the selection signals 60-64 from the debug and test port 22. These signals inform the override selection logic 50 as to which components 24-28 the host system 10 has specified to be included in a scan chain. The override selection logic 50 asserts an output master override signal 80 to all of the gates 40-44 if any of the individual component override signals 70-74 are asserted and selection signal 60-64 from the debug and test port 22 corresponding to such individual component override signal(s) is asserted. That is, if the host system 10 commands a certain component 24-28 to be included in the scan chain, but unbeknownst to the host system 10 that particular component cannot be included, the override selection logic disables the entire scan chain. As such, the override selection logic 50 guarantees that all of the components 24-28 in SUT 20 are eliminated from the scan chain specified by the host system 10. Moreover, the potentially unpredictable and improper SUT behavior is minimized or prevented.

In FIG. 1, each AND gate 40-44 receives three input signals. The selection signals 60-64 from the debug and test port are provided to the gates. Also, the component override signal 70-74 and the master override signal 80 are provided to each gate and cause the components to be deselected. In other embodiments, each gate only receives two input signals—the selection signals 60-64 and the master override signal 80. In this latter embodiment, a component override signal 70-74 is not provided directly to the corresponding gate and, instead is provided to the override selection logic 50 which then broadcasts the master override signal 80 to each gate 40-44.

In addition to automatically deselecting all components from a scan chain if any one or more of the components cannot be included in a scan chain specified by the host system 10, the SUT 20 also informs the host system 10 that the scan chain has been disabled. Any of a variety of techniques can be implemented to inform the host system 10 that the scan chain has been disabled. Examples of such techniques to inform the host system 10 include notification through a designated debug test pin or a notification through the scan chain's output pin. These two techniques are discussed below.

Figure 2:
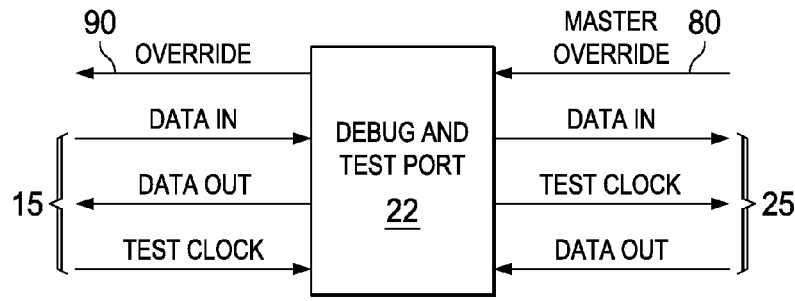
FIG. 2 illustrates an embodiment of reporting a premature termination of a scan chain in accordance with preferred embodiments of the invention.

In the first technique of notifying the host system 10, FIG. 2 illustrates that the electrical communication link 15 between the SUT 20 and host system 10 includes a conductor 90 dedicated for the purpose of notifying the host that the scan chain has been disabled. When the override selection logic 50 asserts the master override signal 80 to the debug and test port 22 which, in turn, asserts an override signal 90 back to the host system 10. The host system 10 detects the override signal 90 and interprets the signal as indicating that the scan chain has been disabled. This technique requires a dedicated test port pin to communicate the deactivation of the scan chain to the host system 10.

If it is not desirable to dedicate an extra pin for the purpose of communicating to the host system 10 that the scan chain has been disabled, the second technique noted above can be used. In this latter technique, a predefined output bit sequence is forced onto the output signal from the SUT 20 to the host system 10. The particular predefined output bit sequence is not an output bit sequence that would normally occur during normal system operation. Instead, the predefined output bit sequence is detected by the host system 10 and interpreted as an indication that the scan chain has been deactivated by the SUT 20. A dedicated pin is not used in this embodiment and, instead, the normal output pin of the debug and test port 22 is used to communicate that the scan chain has been deactivated. The following describes one embodiment of this technique in the context of a JTAG implementation. In a JTAG implementation the communication link 15 between the host system 10 and SUT 20 includes various JTAG-compliant signals such as test data in (TDI), test data out (TDO), and test clock (TCK). These JTAG-compliant signals are also provided on signals 25 provided to each component and multiplexer as shown in FIG. 1.

Figure 3:
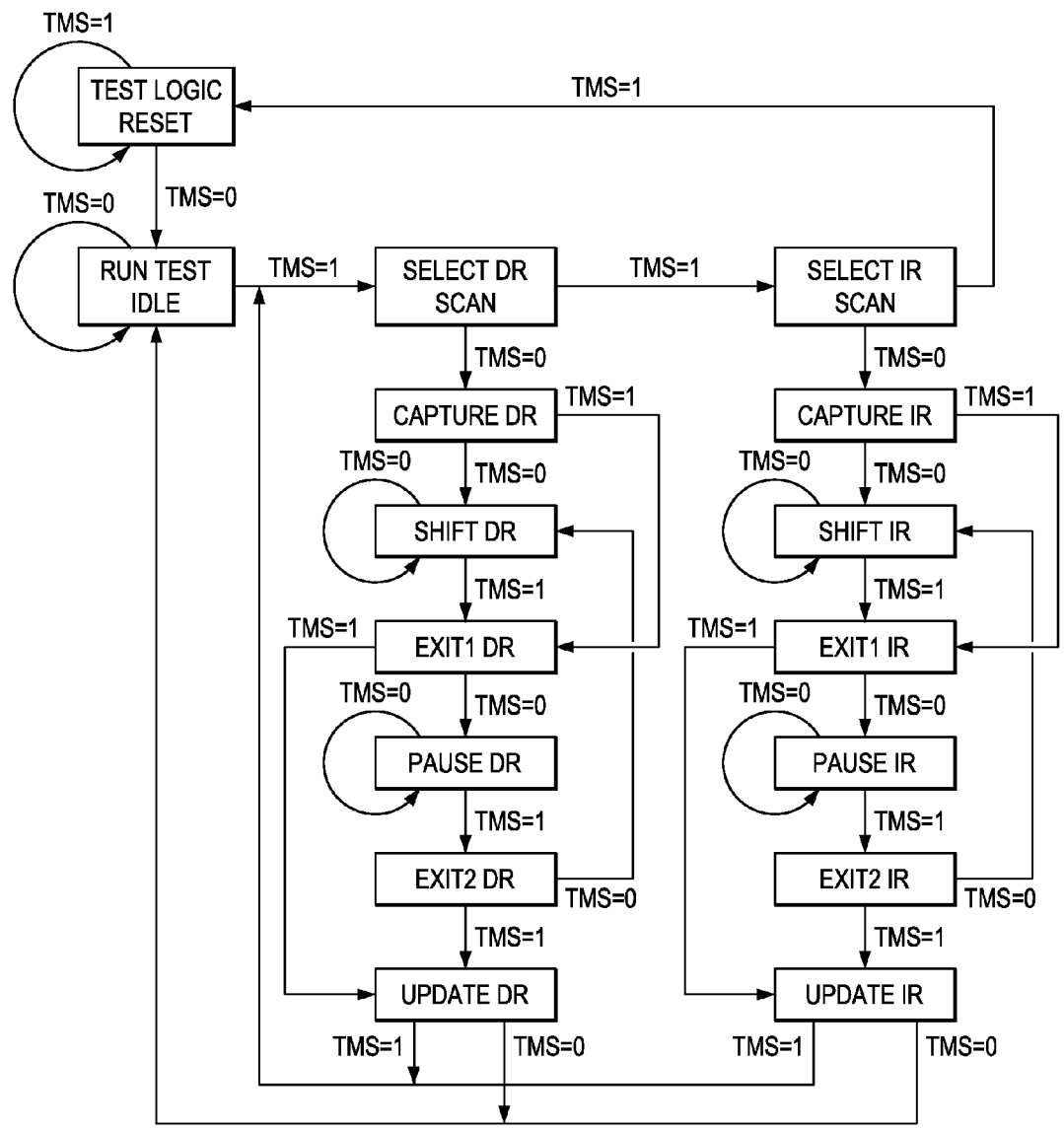
FIG. 3 illustrates the state transition diagram for a Test Access Protocol (TAP) state machine within a JTAG-enabled system in accordance with at least some preferred embodiments.

FIG. 3 shows the Test Access Port Protocol of the IEEE 1149.1 standard, and is also described in copending application Ser. No. 11/423,702 entitled "System and Method for Improved Performance and Optimization of Data Exchanges Over a Communications Link," filed Jun. 12, 2006 and incorporated herein by reference. The TAP state machine enables scans through two scan paths or registers. The Instruction Register (IR) scan path and TAP states enable scan through an instruction register. The data register (DR) scan path and TAP states enable scan through one or more data registers. IR instruction scanned into the IR can modulate the DR scan path and thus which DR is scanned on the next trip through the DR TAP states.

In accordance with the preferred embodiments of the invention, a new scan register called the status register (SR) 59, FIG. 5, is provided. The SR 59 preferably is a 1-bit register that is coupled between each component's TDI pin and the component's TDO pin. The SR 59 scan path functions differently than the IR and DR scan paths.

When multiple TAPs (one associated with each component 24-28) are connected in series, either statically or dynamically, the total IR scan path of the SUT 20 is the sum of the IRs of each of the TAPs in the series connection. For example, if three TAPs are connected in series, and a BYPASS IR instruction has been scanned into the IR of each TAP in the series, then the total DR path length between the device TDI and device TDO pins will be 3, one bit from each of the three TAPs. The SR scan path is different. Regardless of the number of TAPs connected in series within the device, the SR scan path is always 1 bit between the TDI and TDO of the SUT 20. Alternately the characteristics of the 1149.1 standard requires a minimum two bit instruction register with a capture value of with both a logic one and a logic zero for the first bits scanned out. Outputting an IR scan non-standard value for these two bits can be used to indicate the scan chain is non functional.

Shifting through the data registers occurs during the Shift-DR state of FIG. 3. Similarly, shifting through Shift-IR state occurs during the Shift-IR state. Only during these two states is the value on the TDI pin shifted in and a value is shifted out on the TDO pin. When the TAP is in any of the other states shown in FIG. 3, the TDI and TDO pins are not used.

Shifting through the SR 59 shift path occurs during Idle, Pause-DR and Pause-IR states. For each TCK cycle, data is shifted in through the TDI into the 1-bit SR while the existing SR value is shifted out through the TDO pin.

When one of the SR shift states is entered, a 0 will be output on the device TDO instead of the value in the SR 59 bit. This condition persists until the host system 10 takes explicit actions to clear the condition through the IR and DR scans. It is expected that the host system 10 will drive a logic 1 on the TDO during the SR shift states. If multiple components 24-28 are present, connected in series, and members of the host system-initiated scan chain, then when one of the components 24-28 asserts its component override signal 70-74, a 0 value is introduced by the faulting component. That 0 value is then shifted through the rest of the components in the scan chain. The host system 10 samples the value of the TDO signal from the SUT 20 and, if all 0's are detected, determines that a change in scan path topology has occurred. Further, if the host system 10 knows the number of components in the scan chain, the host system 10 can determine the particular component that had the problem by counting the number of TCK cycles until a 0 is detected on TDO. This process is similar to the required IR scan capture value being either both a logic 1 or logic 0 indicating a broken scan chain.

Figure 4:
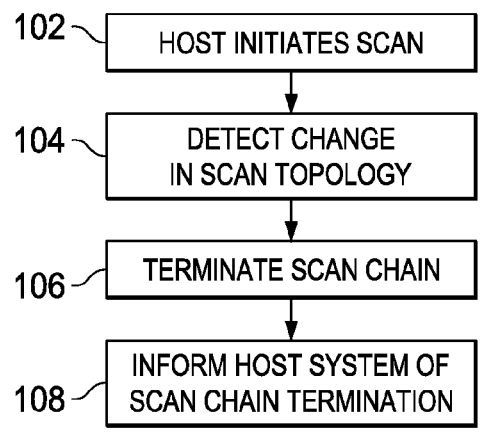
FIG. 4 shows a method in accordance with preferred embodiments of the invention.

FIG. 4 shows a method 100 in accordance with various embodiments. Method 100 includes at least actions 102-106, although other actions may be included. Further, the order of the actions shown in FIG. 4 can be varied as desired. At 102, the host system 10 initiates a scan chain. At 104, a change in the scan chain topology is determined and at 106, the scan chain is terminated as described above. Terminating the scan, in some embodiments, means blocking or preventing the scan states from progressing. At 108, the termination of the scan chain is communicated back to the host system 10.

FIG. 5 shows an embodiment illustrating an embedded TAP controller 27 (embedded in component 26, for example). The embedded TAP controller includes TDI and TDO pins. The multiplexer 34 associated with component 26 is also shown. As explained above, multiplexer 34 outputs either the scan path from the preceding multiplexer (multiplexer 32 in this case) or the TDO from the embedded TAP controller in component 26, as specified by the selection signal 52. The selection signal 52 is also gated with the TCK clock signal to the embedded TAP controller 27. By gating the TCK clock signal, the state of the embedded TAP controller 27 can be frozen via the selection signal 52. The operation of the other components 24 and 28 (and their embedded TAP controllers) function in a similar manner.

Freezing the embedded TAP controller of each component effectively stops or blocks (at least temporarily) the scan chain states from progressing. Blocking the progression of the scan chain prevents the scan chain from changing the states of the components 24-28. The host system 10 is informed of the block on the scan chain and preferably is informed, as explained above, of which component(s) in the scan chain caused the scan chain to be blocked (i.e., which component that the host system had included in the scan chain could not actually be included in the scan chain due to, for example, power or security reasons).

Once a normal scan chain (i.e., one initiated by the host system 10) has been blocked by the SUT 20, scan chain operation can be restored by another scan operation subsequent to the blockage. The host system 10, armed with the knowledge of which component 24-28 cannot be included in the scan chain, restarts a new scan chain without that particular component. As a result, the override selection logic 50 deasserts its master override signal 80 to let the new scan chain progress through the SUT 20.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system on a chip comprising:
    A. a communications link including a serial test data in lead and a serial test data out lead;
    B. a port coupled to the communications link including the serial test data in lead and the serial test data out lead, and having a chip serial test data in lead, a chip serial test data out lead, and a select output lead;
    C. a first component separate from the port, the first component including an embedded TAP controller, the first component having a test data input coupled to the chip serial test data in lead, a component serial test data output lead, an override output, and a one bit status register coupled to the embedded TAP controller and coupled between the test data input and the component serial test data output lead, the one bit status register being additional to the embedded TAP controller;
    D. multiplexer circuitry having a first input coupled to the chip serial test data in lead, a second input coupled to the component serial test data output, an output, and a control input; and
    E. gating circuitry having a first input coupled to the select output lead, a second input coupled to the override output, and an output coupled to the control input of the multiplexer circuitry.

2. The system of claim 1 in which the TAP controller has states of Test Logic Reset, Run Test Idle, Select-DR, and Select-IR.

3. The system of claim 1 in which the communications link includes a test clock lead and the embedded TAP controller includes a clock input coupled to the test clock lead.

* * * * *